United States Patent [19]

Hunt

[11] Patent Number: 5,467,011
[45] Date of Patent: Nov. 14, 1995

[54] SYSTEM FOR DETECTION OF THE PHASE OF AN ELECTRICAL SIGNAL ON AN ALTERNATING CIRCUIT POWER LINE

[75] Inventor: Paul C. Hunt, Brainerd, Minn.

[73] Assignee: National Rural Electric Cooperative Assn., Washington, D.C.

[21] Appl. No.: 252,075

[22] Filed: Jun. 1, 1994

Related U.S. Application Data

[63] Continuation of Ser. No. 879,204, May 6, 1992, abandoned.

[51] Int. Cl.[6] .................. G01R 19/145; G01R 25/00; H04B 3/54
[52] U.S. Cl. .................. 324/67; 324/107; 340/310.01; 455/3.3
[58] Field of Search .................. 324/66, 67, 326, 324/521, 528–530, 76.77, 107, 108; 340/310 R, 310 A, 310 CP, 870.02, 870.18, 310.01, 310.02; 379/25; 455/3.3

[56] References Cited

U.S. PATENT DOCUMENTS

| | | | |
|---|---|---|---|
| 2,425,554 | 8/1947 | Nelson et al. | 324/530 |
| 3,196,350 | 7/1965 | Dimon | 305/26 |
| 3,274,489 | 9/1966 | Behr | 324/67 |
| 3,656,112 | 4/1972 | Paull | 340/151 |
| 3,659,280 | 4/1972 | Donohoo | 340/310 |
| 3,778,718 | 12/1973 | Bass et al. | 325/139 |
| 3,815,119 | 6/1974 | Finlay, Jr. et al. | 340/310 R |
| 3,829,765 | 8/1974 | Siler | 324/67 |
| 3,911,415 | 10/1975 | Whyte | 340/310 |
| 3,919,640 | 11/1975 | Simciak | 325/30 |
| 3,980,954 | 9/1976 | Whyte | 325/48 |
| 3,991,363 | 11/1976 | Lathrop | 324/529 |
| 4,090,138 | 5/1978 | Voorman et al. | 325/163 |
| 4,151,460 | 4/1979 | Seese et al. | 324/529 |
| 4,177,405 | 12/1979 | Chapdelaine | 315/159 |
| 4,199,761 | 4/1980 | Whyte et al. | 340/695 |
| 4,208,630 | 6/1980 | Martinez | 375/7 |
| 4,241,326 | 12/1980 | Odom | 340/33 |
| 4,415,771 | 11/1983 | Martinez | 179/5 R |
| 4,491,785 | 1/1985 | Pecukonis | 324/67 |
| 4,775,832 | 10/1988 | Pecukonis | 324/529 X |
| 4,801,868 | 1/1989 | Brooks | 324/66 |
| 4,896,117 | 1/1990 | Floweredew et al. | 324/529 X |
| 4,998,059 | 3/1991 | Nigon et al. | 324/67 |
| 5,264,795 | 11/1993 | Rider | 324/306 |

OTHER PUBLICATIONS

Remote Meter Reading, Load Control and Distribution System Automation Utilising SWD Technology, P. Foord, J. Tsoucalas Electricity Trust Of South Australia, Nilsen Industrial Electronics UK.

*Primary Examiner*—Gerard R. Strecker
*Attorney, Agent, or Firm*—Zarley, McKee, Thomte Voorhees & Sease; Mark D. Frederiksen

[57] ABSTRACT

A data transmission system for power line carriers includes a transmitter which generates a stable carrier frequency at a bandwidth of less than one hertz. The transmitter is connected to the power line to transmit the generated frequency over the power line to a receiver. The receiver implements filters of a bandwidth of one hertz or less to attenuate any signals that do not correlate with the generated frequency. Information on the phase of the power line to which the transmitter is connected is represented in the form of a generated signal which modulates the stable frequency generated by the transmitter on the power line. The receiver is located on another portion of the power line and compares the phase information from the transmitter with the phase of the power line to which the receiver is connected and displays the resulting comparison for interpretation.

10 Claims, 4 Drawing Sheets

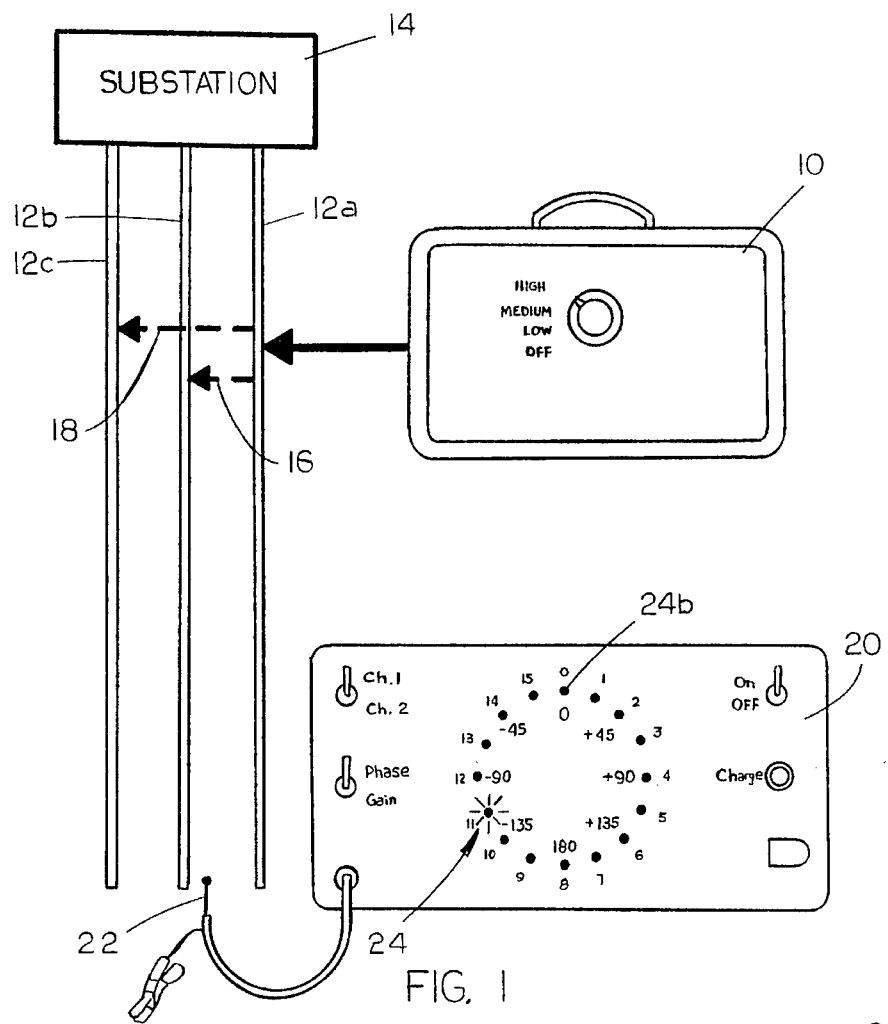
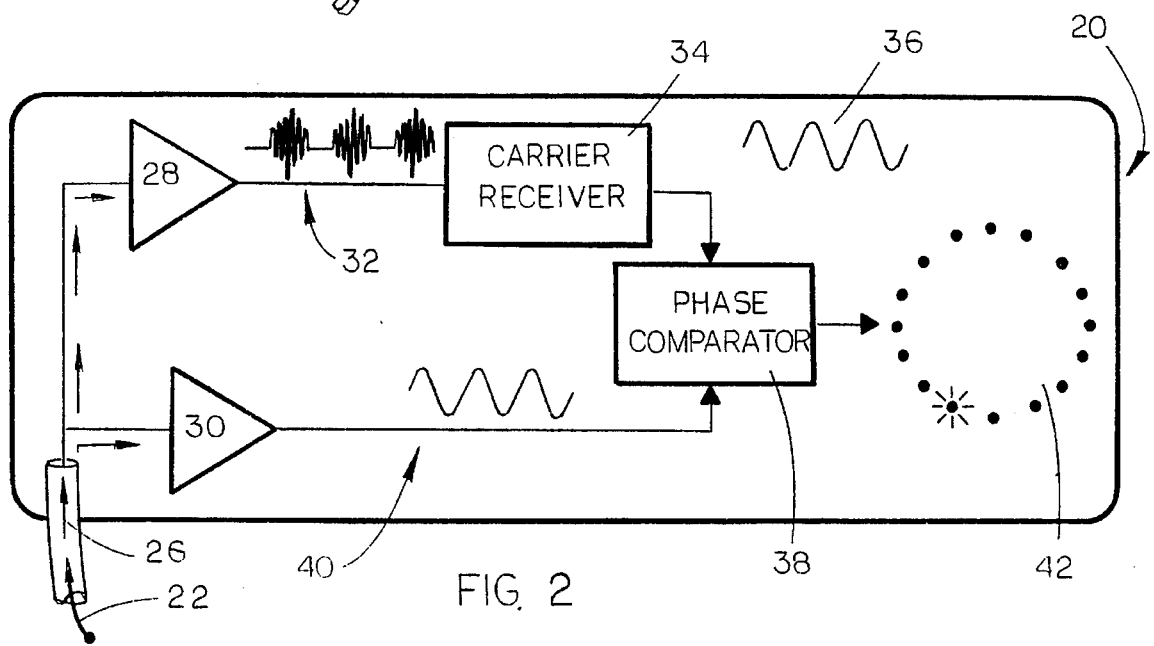
FIG. 1
FIG. 2

SYSTEM FOR DETECTION OF THE PHASE OF AN ELECTRICAL SIGNAL ON AN ALTERNATING CIRCUIT POWER LINE

CROSS-REFERENCE TO RELATED APPLICATION

This is a continuation application of Ser. No. 07/879,204 filed May 6, 1992, now abandoned.

TECHNICAL FIELD

The present invention relates generally to data transmission systems for power line distribution networks, and more particularly to a data transmission system which utilizes ultra narrow bandwidth signals.

BACKGROUND OF THE INVENTION

Various communication systems have been proposed for remotely monitoring and controlling the use of electric energy supplied to large numbers of customer locations. Large numbers of geographically disbursed residential electric power customers are supplied electric energy by distribution networks. It is often desired to control and monitor the levels of electric energy supplied by the distribution network from a central control station. One system for a remotely controlled or automated distribution system is disclosed in U.S. Pat. No. 3,911,415, wherein bidirectional carrier communication signals are transmitted over power line conductors between a central station and each of large numbers of electric power customers. U.S. Pat. No. 3,659,280 discloses a power line carrier communication system wherein plural transmitters and receivers are operated at different selective frequencies of signals transmitted over the power lines. U.S. Pat. No. 3,980,954 discloses and claims a bidirectional communication system which utilizes a VHF-FM broadcast transmitter signal which is modulated with interrogation or command signals transmitted to radio receivers at each customer location. Response signals from the customer locations are transmitted by carrier signals applied through the power lines.

In U.S. Pat. No. 3,815,119, a remote meter reading system as described utilizing electric power lines and a mobile radio interrogating arrangement. A plurality of meters have separate transmitters for transmitting meter data at different frequencies to receivers mounted on utility poles and connected to the power lines to receive the transmitter signals. The receiver signals are coupled to a transponder which includes a radio transmitter. Transmitted radio signals are produced including serial transmissions of the meter readings of each separate meter.

In U.S. Pat. No. 3,919,640, a remote meter reading system includes an RF radio communication link. Digital and analog data signals are transmitted on different frequency channels through the radio link. In U.S. Pat. No. 3,656,112 a remote utility meter reading system includes a communication system which produces carrier signals over the power line and also a radio link. A general addressing technique is utilized in each of the aforementioned systems wherein each remote location includes a unique binary coded address and the communication signals are transmitted in a serial fashion with each remote location being signaled or responding in a sequential manner with the associated location being designated by a unique code.

The term "power line carrier" (PLC) is commonly used when referring to the art of transmitting communications or controls signal over a power line. PLC was initially utilized by power utilities as a means for controlling widely distributed loads. Since its inception, PLC has developed and been used to control circuit breakers, synchronized clocks, and transmit voice and computer data. However, despite the wide variety of existing uses, PLC has never become a popular communications medium.

Power lines are a hostile environment for communications signals. PLC transmitters need to be powerful to overcome electrical noise and signal attenuation caused by all of the equipment on the power line. Because of this, most PLC has a very limited range, e.g. within the perimeter of a house. It requires expensive and powerful commercial PLC systems to signal from a local substation to a customer's house. Most modern PLC systems send only data.

In modern PLC systems, the system architecture is such that it is advantageous to send data as fast as possible. This requires the PLC communication equipment to have as wide a bandwidth as practical. The need for fast response and the traditional difficulty of making narrow bandwidth filters has effectively prevented engineers from seriously considering ultra narrow bandwidths for PLC systems.

It has long been understood among communication engineers that as the bandwidth of a communications system is narrowed (thereby slowing it down), it becomes more immune to noise. Until now, due to the practical considerations discussed above, power line carriers have not been able to carry this principal to extremes.

It is therefore a general object of the present invention to provide an ultra narrow bandwidth data transmission system for use on electric power distribution systems for achieving superior signal to noise ratio under a given transmission power.

Another object of the present invention is to provide an ultra narrow bandwidth data transmission system to a power line carrier, to thereby achieve high signal reliability using very low transmitter power.

Another object is to provide an ultra narrow bandwidth data transmission system capable of operating over power transmission lines to provide pertinent data regarding the power transmission lines.

These and other objects will be apparent to those skilled in the art.

SUMMARY OF THE INVENTION

The data transmission system for power line carriers of the present invention includes a transmitter which generates a stable carrier frequency modulated to occupy a bandwidth of less than one hertz. The transmitter is connected to the power line to transmit the generated frequency over the power line to a receiver. The receiver implements filters of a bandwidth of one hertz or less to attenuate any signals that do not correlate with the generated frequency. Information on the phase of the power line to which the transmitter is connected is represented in the form of a modulation to the stable carrier frequency generated by the transmitter on the power line. The receiver is located on another portion of the power line and compares the phase information from the transmitter with the phase of the power line to which the receiver is connected and displays the resulting comparison for interpretation.

BRIEF DESCRIPTION OF THE DRAWINGS

FIG. 1 is a graphic illustration of one example of a data transmission system using ultra narrow bandwidth;

FIG. 2 is a generalized block diagram of the receiver of FIG. 1;

DESCRIPTION OF THE PREFERRED EMBODIMENT

Figure 3:
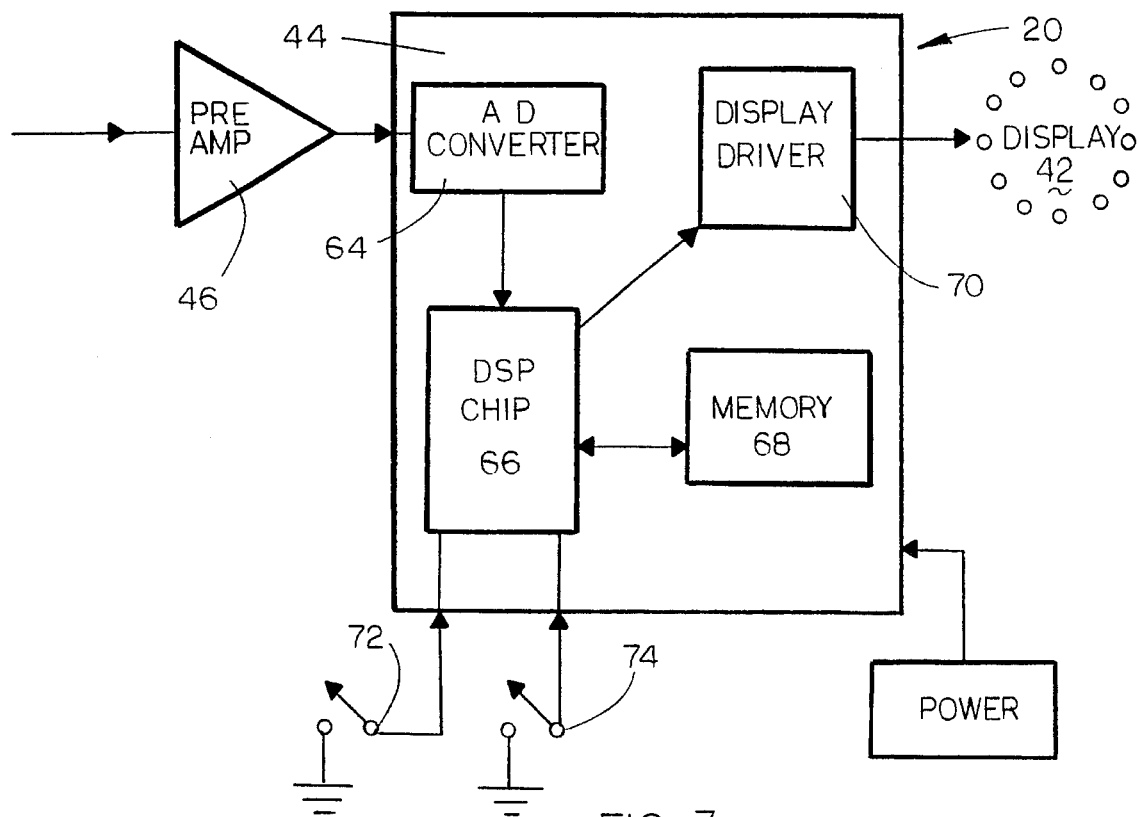
FIG. 3 is a combined schematic and block diagram of the receiver of FIG. 2.

In my patent application, entitled "Ultra Narrow Bandwidth Low Baud Data Communications System", Ser. No. 07/631,390, now abandoned, which is incorporated herein by reference, the ultra narrow bandwidth data transmission system of the present invention is applied towards collecting information from airfield lighting systems. This problem is qualitatively similar to collecting electrical power meter readings from residences and other commercial power users. The invention of the present patent application affords the advantage of utilizing extremely narrow bandwidth communications without requiring high stability components. Applications of the invention provide data transmission at bandwidths of 0.001 Hz at radio frequencies, an achievement this inventor believes was generally considered impractical.

By comparison, a narrow band FM radio is typically about 15,000 Hz. U.S. Pat. No. 3,659,280 refers to a "narrow bandwidth" of 3,000 Hz on a power line carrier. State of the art PLC polling systems, such as those described in U.S. Pat. Nos. 3,656,112 and 3,911,415, are 30–300 Hz bandwidth. For purposes of the present application, ultra narrow bandwidth may be defined as any communications system wherein the receiver has a bandwidth of less than 1 Hz.

Those skilled in this art will recognize that power line phase is only one of many kinds of information that can be modulated onto an ultra narrow bandwidth carrier. Examples of other applications which can benefit from ultra bandwidth power line carrier technology include (a) remote meter reading, (b) remote control, (c) phase tracing test equipment, (d) etc. In the preferred embodiment of this invention, a phase tracing apparatus is described which determines the phase of a power line.

It is conventional for electric power distribution substations to have three-phase circuits extending from a substation. Proper phase identification for underground circuits has always been a problem. Often, the only way to verify such phasing is to de-energize each phase, one at a time. Such a procedure is obviously not a simple and desirable method. For this reason, an apparatus is provided which can simply plug into the conventional 110 volt alternating current standard outlet so as to transmit a signal over a power line. A receiver may then be located proximal to the power line to be tested, so as to indicate the phase of that particular power transmission line. FIG. 1 is a graphic illustration of this concept.

As shown in FIG. 1, a transmitter 10 is plugged into one phase power line 12a coming from substation 14. The signal produced by transmitter 10 will inherently cross couple to the other phase power lines 12b and 12c which feed from substation 14, as shown by arrows 16 and 18. This signal is modulated with the phase of the power that feeds the transmitter 10 as discussed in more detail hereinbelow.

The receiver 20 includes a probe 22 which is brought near the electric field of any power line 12a, 12b or 12c which is powered by substation 14. A display lamp 24 on receiver 20 will light to indicate the phase angle. When properly calibrated, a reading of zero degrees, indicated at 24b, indicates the same phase as the transmitter.

Referring now to FIG. 2, a generalized block diagram of receiver 20 shows that probe 22 picks up the electric field of a power line and transmits a signal, as shown by arrows 26. The signal is split and transmitted to a carrier frequency amplifier 28 and a 60 Hz amplifier 30. The received carrier signal contains modulation with the 60 Hz reference phase, as shown at 32 in FIG. 2. This 60 Hz reference is recovered at carrier receiver 34, and shown at 36, and thence transmitted to phase comparator 38. The local 60 Hz signal is shown at 40 and is transmitted from the 60 Hz amplifier to the phase comparator, where the phase difference between the two signals is transmitted to the display 42. An example of a practical carrier frequency is 8 kHz.

Figure 4:
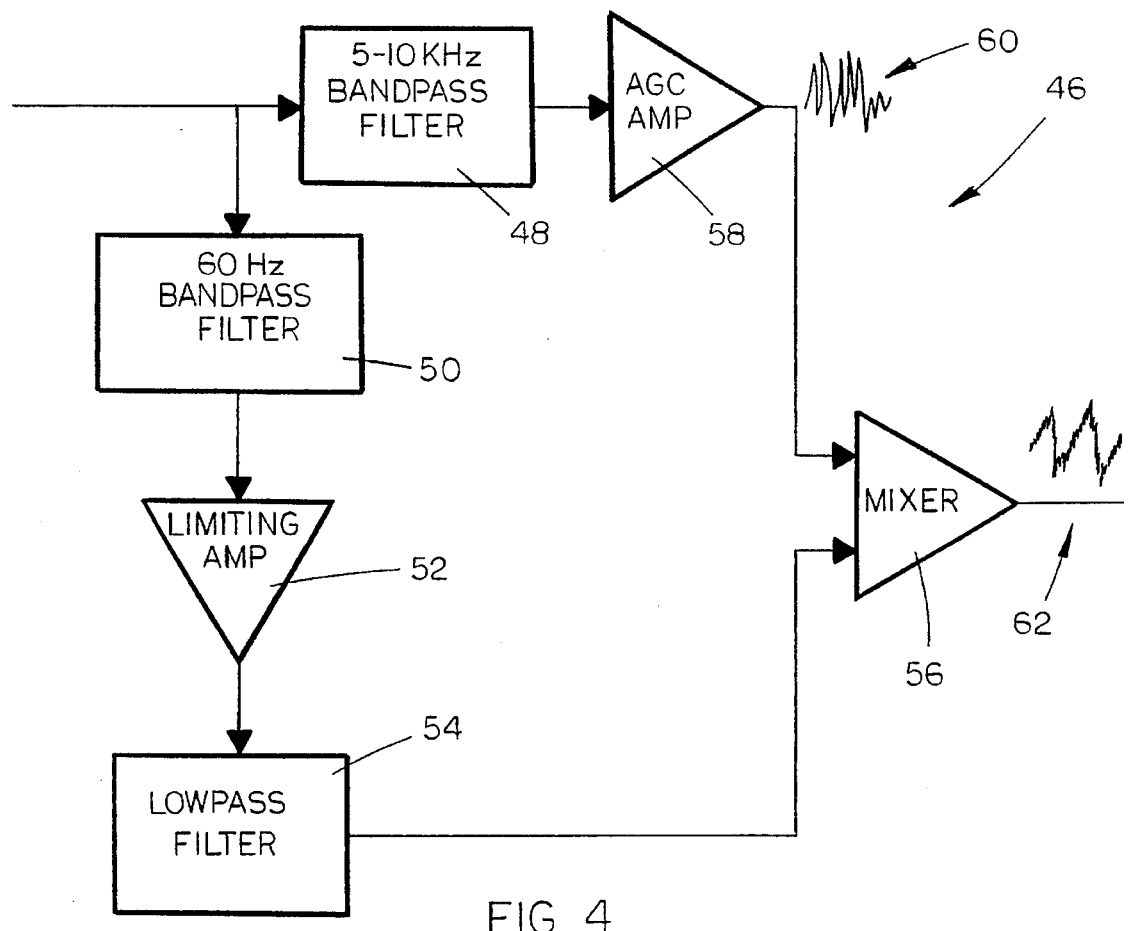
FIG. 4 is a block diagram of the pre-amp of FIG. 3.

Referring now to FIGS. 3 and 4, FIG. 3 shows a block diagram of an actual receiver 20 utilizing a digital signal processing circuit board 44, while FIG. 4 is a detailed block diagram of the preamp 46 of FIG. 3. Preamp 46 (see FIG. 4) is a circuit which keeps the 60 Hz signal and the carrier signal at a constant ratio so as to improve the sensitivity of the overall receiver. The carrier signal from probe 22 is split and transmitted to a carrier frequency band pass filter 48 and a 60 Hz band pass filter 50. Filter 50 passes 60 Hz phase information from the local power line under test to limiting amp 52 and thence to low pass filter 54, which passes a 60 cycle signal to mixer 56. Filter 48 passes the carrier signal to AGC amp 58 producing a signal and noise as shown at 60, which is transmitted to mixer 56 to produce the output signal shown at 62 for transmission to the circuitry on circuit board 44.

Referring now to FIG. 3, the composite voltage signal from pre-amp 46 is converted to a digital representation by AD converter 64. A digital signal processor consisting of DSP chip 66 and memory 68 performs functions of the narrow bandwidth carrier receiver 34 (FIG. 2) and phase comparator 38 (FIG. 2). In this digital signal processor, major functions such as filtering, demodulating and phase comparing are done in software. The resulting information is sent to the display driver 70 and display 42. The switches 72 and 74 direct the software to display test information or to change carrier frequency. The software determines bandwidth In this application, the bandwidth is set to about 0.5 Hertz. This allows great sensitivity and noise immunity and reasonable transmitter power and response time.

Figure 5:
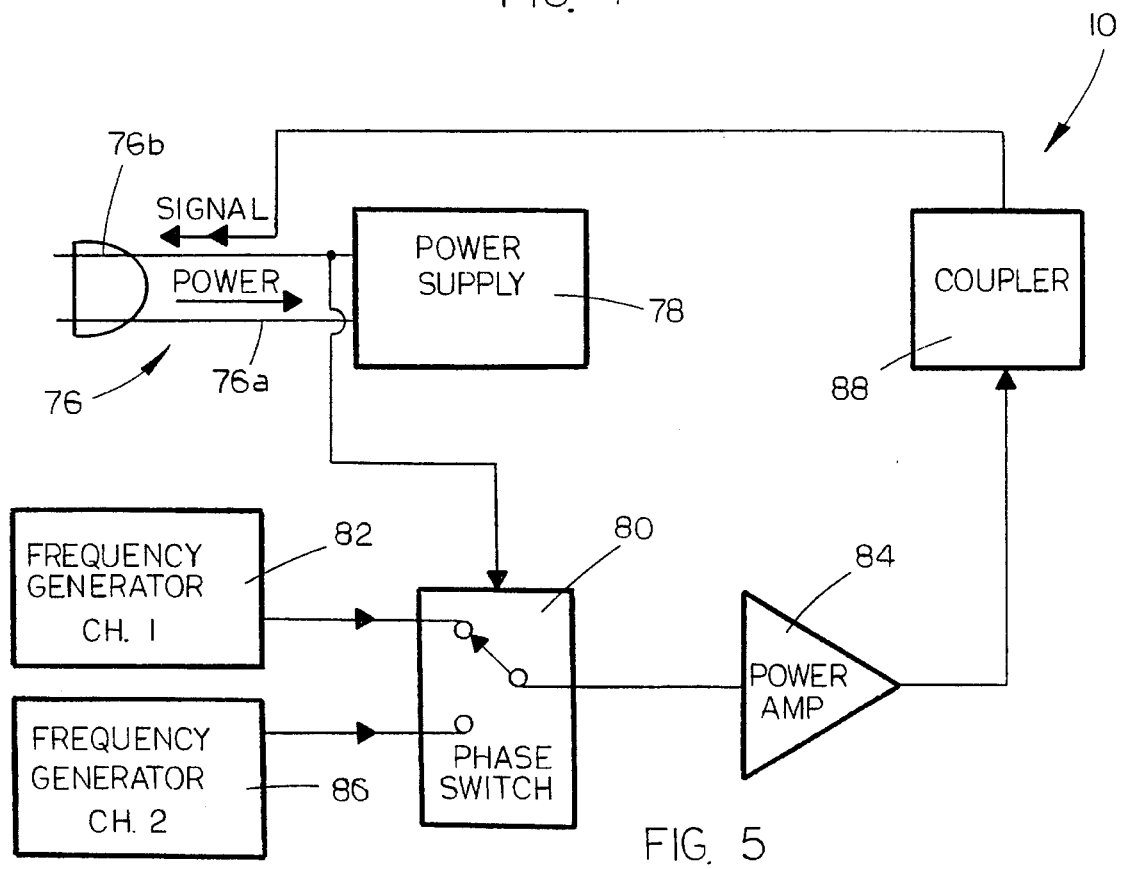
FIG. 5 is a combined schematic and block diagram of the transmitter of FIG. 1.

FIG. 5 is a block diagram of transmitter 10, which is connected to the appropriate power line via plug 76 which carries 110 volts alternating current to power supply 78. The power line wave form is transmitted to phase switch 80 from AC hot lead 76b. Phase switch 80 connects carrier frequency generator channel 1, identified at 82, to a power amp 84 while the line voltage is positive, and connects carrier frequency generator channel 2 (identified at 86) while the line voltage is a negative. This results in the transmission of essentially the same information on two different carrier frequencies. The redundancy of this system improves the receiver's chances of "seeing" a clean signal in spite of noise or a fading signal on either channel. From the power amp 84 the signal is transmitted to coupler 88 which couples the signal to and transmits the signal over the power line through plug 76.

Figure 6:
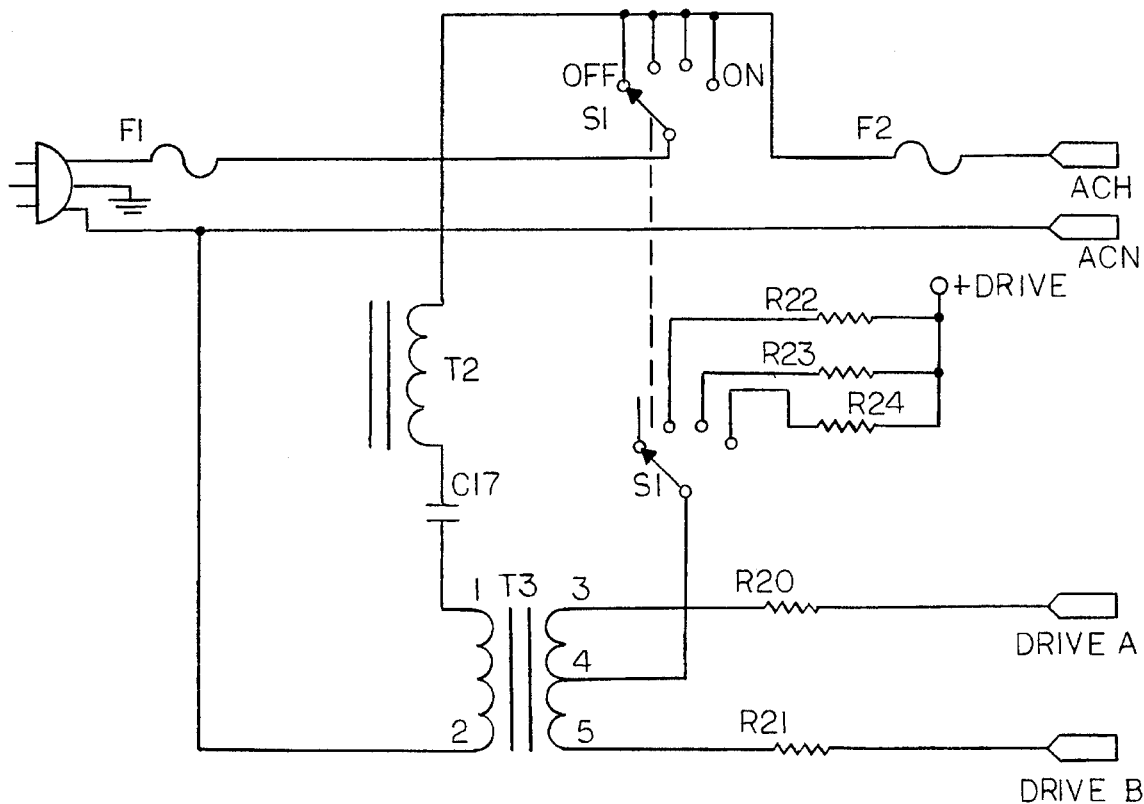
FIG. 6 is a schematic diagram of a portion of the transmitter circuit.
Figure 7:
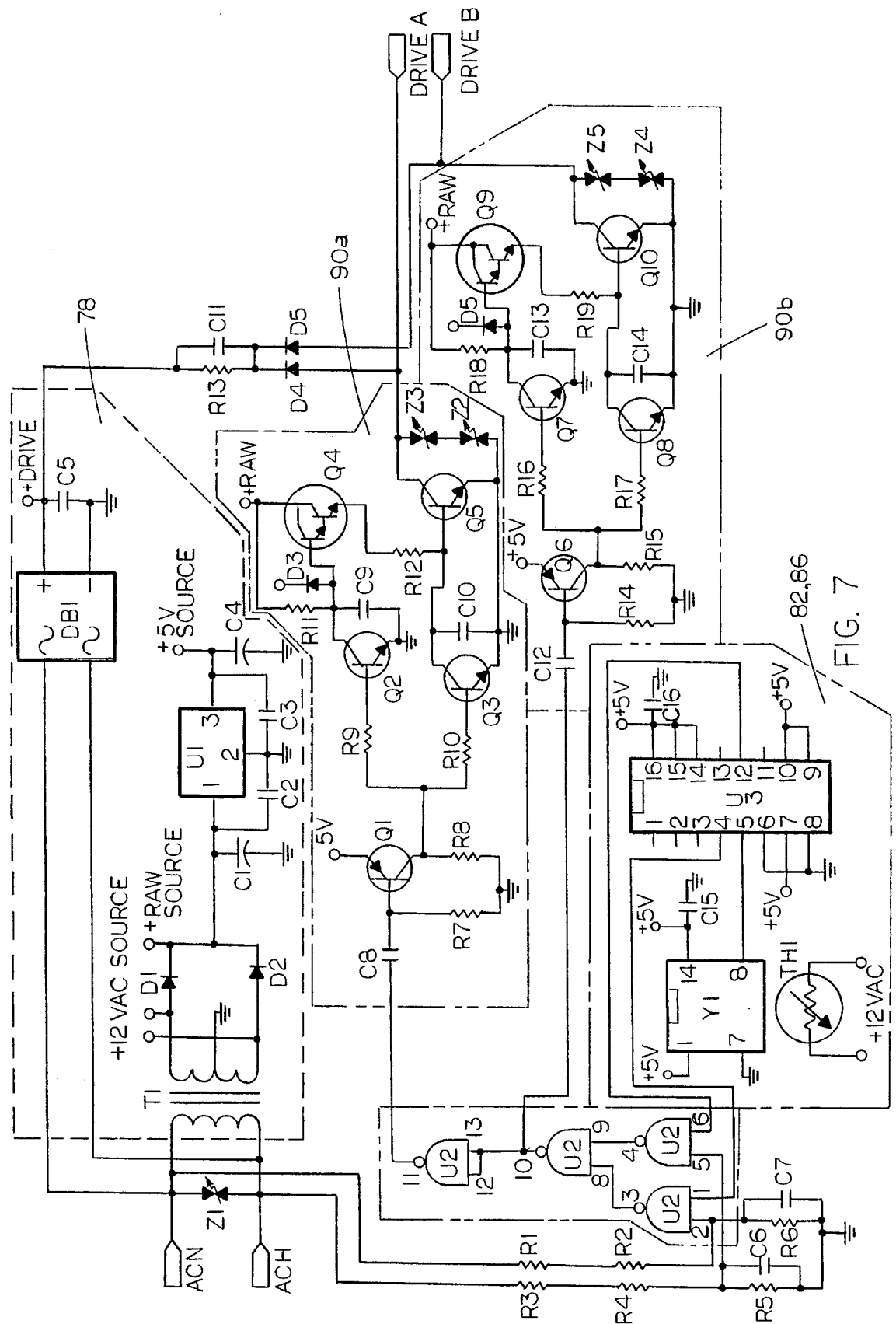
FIG. 7 is a schematic diagram of a portion of the transmitter circuit.

Referring now to FIGS. 6 and 7, FIG. 6 is a schematic diagram of the off board alternating current wiring for the transmitter, while FIG. 7 is a schematic diagram of the circuit board. As shown in FIG. 7, alternating current power comes in through transformer T1, is rectified by diodes D1 and D2, and is then filtered by capacitor C1 and regulated by U1. Transformer T1 provides a +12 volt AC source; an approximately +10 volt (+raw) source is provided after the power is rectified by diodes D1 and D2; and a +5 volt source is provided after filtering and regulating by C1 and U1. The raw source and +5 volt source provide power for the logic circuits, while the +12 volt AC source provides power to thermistor TH1 which stabilizes the temperature of frequency generators 82, 86. The 110 volt AC power source is rectified by diode bridge DB1 to provide power (+Drive) to the output driver stage (shown in FIG. 6).

Y1 is a crystal controlled oscillator which has the thermistor TH1 in thermal contact therewith. Oscillator Y1 feeds U3, which contains two programmable frequency dividers. The channel 1 frequency comes out pin 4 and is transmitted to pin 1 of phase switch U2, while channel 2 frequency comes out of pin 12 of U3 and is transmitted to pin 6 of phase switch U2. Thus, phase switch 80 of FIG. 5 is represented as phase switch U2 in FIG. 7.

The NAND gates of U2 compare the instantaneous polarity of the power line such that, at pin 10, frequency 1 appears when the power line is positive and frequency 2 appears when the power line is negative. This signal is fed directly from pin 10 to the Drive B circuit 90b. The signal is inverted and transmitted out of phase from pin 11 of U2 to the Drive A circuit 90a. Power amp 84, shown in FIG. 5, consists of drive circuits 90a and 90b which constitutes a push-pull transformer driver, with both sides identical. The inverted out-of-phase signal from pin 11 of U2 is AC coupled to transistor Q1 via capacitor C8 and resistor R7. This provides automatic shutdown if the signal from pin 11 is missing. When transistor Q1 is on, it turns transistors Q2 and Q3 on, thereby turning transistors Q4 and Q5 off. When transistor Q1 is turned off (by signal from U2) Q2 and Q3 are both turned off, which allows transistor Q4 to turn on, which in turn drives transistor Q5 on hard. When Q5 is again turned off, any high voltage transient generated by the transformer inductance is shunted through diode D4 to ground via capacitor C11, resistor R13, and capacitor C5. Transient absorbers Z2 and Z3 provide additional safety.

Side 90b of drive circuit 90 is identical to side A, but receives its signal from pin 10 of U2 and transmits the signal to Drive B. Referring again to FIG. 6, transformer T3 gets driven at the carrier frequency alternately by Drive A and Drive B. Resistors R20 and R21 limit peak current. Switch S1 and resistors R22, R23 and R24 determine the power output level by further limiting the current. Transformer T3, inductor T2 and capacitor C17 constitute the power line coupler 88 shown in FIG. 5. The 20 turn output winding of transformer T3 matches the impedance of the power line. The signal is coupled through capacitor C17 and harmonics are attenuated by inductor T2.

| $C_1$ | 3300 uF, 16 V | $R_1$ | 1M |
|---|---|---|---|
| $C_2$ | .1 uF | $R_2$ | 1M |
| $C_3$ | .1 uF | $R_3$ | 1M |
| $C_4$ | 33 uF, 16 V | $R_4$ | 1M |
| $C_5$ | .68 uF, 250 V | $R_5$ | 1M |
| $C_6$ | 150 pF | $R_6$ | 1M |

-continued

| $C_7$ | 150 pF | $R_7$ | 100K |
|---|---|---|---|
| $C_8$ | .0022 uF | $R_8$ | 100K |
| $C_9$ | .01 uF | $R_9$ | 1K |
| $C_{10}$ | .01 uF | $R_{10}$ | 820 Ohm |
| $C_{11}$ | .68 uF, 250 V | $R_{11}$ | 1K |
| $C_{12}$ | .0022 uF | $R_{12}$ | 1K |
| $C_{13}$ | .01 uF | $R_{13}$ | 18K, 2 W |
| $C_{14}$ | .01 uF | $R_{14}$ | 100K |
| $C_{15}$ | .1 uF | $R_{15}$ | 100K |
| $C_{16}$ | .1 uF | $R_{16}$ | 1K |
| $C_{17}$ | 10 uF, 330 VAC | $R_{17}$ | 820 Ohm |
| $D_1$ | 1N4007 | $R_{18}$ | 1K |
| $D_2$ | 1N4007 | $R_{19}$ | 1K |
| $D_3$ | 1N4007 | $R_{20}$ | 10 Ohm, 25 W |
| $D_4$ | 1N4007 | $R_{21}$ | 10 Ohm, 25 W |
| $D_5$ | 1N4007 | $R_{22}$ | 3.3K, 10 W |
| $D_6$ | 1N4007 | $R_{23}$ | 300 Ohm, 50 W |
| $F_1$ | 4 Amp | $R_{24}$ | 50 Ohm, 700 W |
| $F_2$ | 1 Amp | $T_1$ | 110 V, 12 VCT |
| $Q_1$ | PN 2907 | $T_2$ | #16 wire on Ferrite |
| $Q_2$ | NPN 2222 | | Core 50 to 200 uh |
| $Q_3$ | NPN 2222 | $Y_1$ | 1.8 MHZ OSC |
| $Q_4$ | TIP 122 | $Z_1$ | 220 V |
| $Q_5$ | 2SD 1398 | $Z_2$ | 220 V |
| $Q_6$ | PN 2907 | $Z_3$ | 220 V |
| $Q_7$ | NPN 2222 | $Z_4$ | 220 V |
| $Q_8$ | NPN 2222 | $Z_5$ | 220 V |
| $Q_9$ | TIP 122 | | |
| $Q_{10}$ | 2SD 1398 | | |
| $TH_1$ | 30° C. PTC DIGI-KEY#KC001P-ND | | |

Whereas the invention has been shown and described in connection with the preferred embodiments thereof, it will be understood that many modifications, substitutions and additions may be made which are within the intended broad scope of the appended claims. For example, in another embodiment of the invention, such as for remote meter reading, the transmitter causes low frequency (less than 50 Hz) energy to be modulated onto the power line. This low frequency carrier is modulated with information at less than 1 bit every 100 seconds. The receiver uses digital filters or digital signal processing to receive the signal at one hertz or less bandwidth. This is very slow but very resistant to interference even when using low power transmitters.

In addition, the phrase "ultra narrow bandwidth" as utilized herein, does not necessarily mean that the transmitter must produce a pure frequency. Rather, it is intended to encompass transmitters which produce a periodic wave form which is highly predictable over a time frame of at least one second. Any transmitter that can produce such a signal would have a narrow bandwidth effect over such a time period, even though it does not rely on a single frequency. Similarly, the receiver would implement filters that attenuate signals that do not correlate with the predicted signal over a time frame of at least one second.

There has therefore been shown and described an ultra narrow bandwidth data transmission system for power line carrier which accomplishes at least all of the above stated objects.

I claim:

1. A system for detecting a modulated signal on a remote local power line supplied with power from a main power line having an alternating voltage, said alternating voltage having a known phase defined as a reference phase comprising:

a transmitter for generating a first signal having a stable frequency and modulated with a second signal derived from the reference phase voltage of the main power line;

said transmitter operably connected to said main power line for transmitting said modulated first signal over said power line;

a receiver operable to receive said first signal and its modulation to detect therefrom modulating second signal derived from the reference phase voltage for phase comparison with the phase of an alternating voltage on the local power line:

said receiver being operably connected to said remote power line spaced apart from the location at which the transmitter is connected to said main power line.

2. The system of claim 1, wherein said receiver includes:

means for detecting the alternating voltage of the local power line to which the receiver is operably connected;

means for measuring a phase angle between the detected reference phase with the local phase of the voltage detected in the local power line; and means for displaying the measurement.

3. The system of claim 2, wherein said display means includes means for displaying phase angle information.

4. The system of claim 2, wherein said transmitter is operably connected to said main power line such that said power line supplies power to said transmitter.

5. The date transmission system of claim 1, wherein said transmitter includes:

a phase switch, responsive to said main power line alternating voltage for generating said second signal;

a first frequency generator connected to said phase switch;

a second frequency generator connected to said phase switch;

said phase switch operable to said signal from the first frequency generator when the power line voltage is positive and to transmit said second signal from the second frequency generator when the power line voltage is negative.

6. The data transmission system of claim 2, wherein said transmitter includes:

a phase switch, responsive to said main power line alternating voltage for generating said second signal;

a first frequency generator connected to said phase switch;

a second frequency generator connected to said phase switch;

said phase switch operable to transmit said second signal from the first frequency generator when the power line voltage is positive and to transmit said second signal from the second frequency generator when the power line voltage is negative.

7. The system of claim 6, wherein said display means includes means for displaying phase angle information.

8. The system of claim 6, wherein said transmitter is operably connected to said main power line such that said power line supplies power to said transmitter.

9. The system of claim 1, wherein said transmitter includes means for generating a said stable frequency so as to occupy a bandwidth of less than one hertz, and wherein said receiver is operable at a bandwidth of less than one hertz.

10. An apparatus for measuring the phase angle of alternating voltage on a local power line relative to the phase of alternating voltage on a main power line which supplies power to the local power line, the phase of the alternating voltage on the main power line being defined as a reference phase end the phase of the alternating voltage on the local power line being defined as a local phase, comprising:

a transmitter operably connected to the main power line for transmitting a first signal over said main power line;

said transmitter including means for detecting the reference phase voltage and for generating said first signal, the first signal having a stable frequency and being modulated with a second signal derived from the reference phase voltage;

a receiver operably connected to the local power line for receiving the first signal and its modulation;

said receiver including means for detecting the local phase voltage of the local power line;

said receiver including means for detecting the modulating second signal derived from the reference phase voltage from the received signal and measuring the phase angle of the local phase voltage relative to the second signal; and means on said receiver for displaying the measured phase angle.

* * * * *